United States Patent [19]

Lacombat

[11] 4,367,046

[45] Jan. 4, 1983

[54] OPTICAL SYSTEM FOR ALIGNING TWO PATTERNS AND A PHOTOREPEATER EMBODYING SUCH A SYSTEM

[75] Inventor: Michel Lacombat, Paris, France

[73] Assignee: Thomson-CSF, Paris, France

[21] Appl. No.: 212,618

[22] Filed: Dec. 3, 1980

[30] Foreign Application Priority Data

Dec. 18, 1979 [FR] France ................ 79 30935

[51] Int. Cl.³ .............................. G01B 11/26
[52] U.S. Cl. ....................... 356/400; 355/53
[58] Field of Search ............... 356/399, 400, 401, 150; 355/53

[56] References Cited

U.S. PATENT DOCUMENTS

| | | | |
|---|---|---|---|
| 4,153,371 | 5/1979 | Koizumi et al. | 356/401 |
| 4,171,162 | 10/1979 | Gerard et al. | 356/401 |
| 4,251,160 | 2/1981 | Bouwhuis et al. | 356/150 |

Primary Examiner—R. A. Rosenberger
Attorney, Agent, or Firm—Oblon, Fisher, Spivak, McClelland & Maier

[57] ABSTRACT

An optical system for aligning two patterns in which the alignment takes place in two phases. In the first phase, the first pattern is aligned with respect to a third fixed intermediate pattern, forming a reference, and during the second phase the second pattern is aligned with respect to this third pattern. The first pattern is formed by a pair of alignment reference marks and the third pattern comprises a first pair of complementary reference marks. The second pattern is also formed by a pair of alignment reference marks and the third pattern comprises a second pair of complementary reference marks. In a preferred embodiment, these latter reference marks are formed by optical networks. The projection of one network on the complementary network produces orders of diffraction which are detected by opto-electronic means.

14 Claims, 15 Drawing Figures

OPTICAL SYSTEM FOR ALIGNING TWO PATTERNS AND A PHOTOREPEATER EMBODYING SUCH A SYSTEM

BACKGROUND OF THE INVENTION

The invention relates to an optical system for aligning two patterns using a third pattern or intermediate reference pattern, and in particular to a photorepeater using this optical alignment system for positioning a semiconductor wafer along two reference axes.

The manufacture of integrated circuits involves the formation on a substrate of windows for locating the implantation or the treatment. This substrate is covered with a photosensitive resin layer. The formation of windows is achieved by masking this resin with a mask carried by a reticle. Previously, direct contact or proximity was used as the method of transfer. Present processes use the technique of transfer by optical projection.

This projection may be effected in the ratio 1/1, and the mask is wholly projected onto the wafer. This projection may also be effected by division of the image: either by analysis of the mask through a mobile slit, or by using the photorepetition technique in the ratio 1/n.

In the technique for manufacturing circuits by direct photorepetition, each pattern to be formed is projected directly onto the semiconductor wafer previously covered with a layer of photosensitive resin, in accordance with a pre-established program, the position of the wafer being controlled by interferometry along two directions X and Y. Conventionally, photorepetition is carried out by offsetting the wafer in two directions X and Y orthogonal with respect to each other.

In all cases it is necessary to position, with respect to each other and very accurately, the reticle and the wafer of semiconductor material on which the integrated circuit is to be formed. For this numerous alignment processes have been proposed. In general, use is made of additional patterns comprising alignment reference marks carried by the reticle and by the semiconductor wafer. Depending on the process used, the number of these reference marks, their arrangement or their configuration must be such that they allow alignment along two reference axes X, Y and possibly angular alignment of the semiconductor wafer. Two approaches may be essentially distinguished for obtaining the desired alignment.

According to a first approach, the alignment is achieved by bringing into direct coincidence the alignment reference marks carried by the reticle and the semiconductor wafer or the projection thereof. This first approach raises a certain number of difficulties which will be discussed hereafter. It is well-known that resin is sensitive to a narrow range of wavelengths. The source used for exposure of the pattern to be projected onto the semiconductor wafer, i.e. during exposure of the resin, is either a narrow-spectrum source, as for example a laser, or a wider-spectrum source associated with filters. If a single source is used for the operations of alignment and exposure of the resin, or if more generally two separate sources having the same wavelength are used, care must be taken that the alignment reference marks and the patterns to be projected are illuminated solely during the phases concerned, i.e. respectively during the alignment phase and the exposure phase. It is then necessary to use accurately positioned masks, since the alignment reference marks and the pattern to be projected are very close to each other. Furthermore, if the system for illuminating the alignment reference marks is distinct from that for the exposure, the first system must be retracted during the exposure phase. If an alignment wavelength is used distinct from that of the exposure, lenses or more generally a correction system must then be introduced during the alignment phase, with great positioning accuracy. These lenses or this correction system must also be retracted during the exposure phase. It is furthermore necessary to switch the detection system(s) required for the alignment, this system being for example positioned in the pupil of the objective used for the exposure.

In a second approach, intermediate alignment reference marks are used. With this approach, the alignment, one with respect to the other, of the reticle and of the semiconductor wafer is no longer achieved directly by bringing alignment reference marks or the projection thereof into coincidence, but sequentially by use of intermediate alignment reference marks. Although removing all or part of the difficulties which have just been recalled and which are specific to the first approach, the processes of the known art according to this second approach are complex and multiply the number of intermediate steps required for obtaining the desired alignment. The multiplication of the number of steps, in particular, introduces correlatively the multiplication of the risk of errors and reduces the accuracy of the alignment.

SUMMARY OF THE INVENTION

While belonging to this second approach, and for palliating the disadvantages thereof, the invention has then as its object an optical system for aligning a first pattern carried by a first mobile support with respect to a second pattern carried by a second mobile support by means of a third intermediate pattern forming a reference; said system comprising light energy source means; said system being principally characterized in that it comprises, with the third pattern being supported by a fixed support, first optical means with +1 magnification, combining optically the first and third patterns and first opto-electronic means detecting the coincidence of the optical projection of one of said two patterns on the other, and in that it comprises further second optical means of a given magnification combining optically the second and third patterns and second opto-electronic means detecting the coincidence of the optical projection of one of these two patterns on the other one.

The invention also has as its object a photorepeater using such an optical alignment system.

DESCRIPTION OF THE DRAWINGS

The invention will be better understood and other characteristics and advantages will appear from reading the following description with reference to the accompanying figures, in which.

DESCRIPTION OF THE PREFERRED EMBODIMENTS

In what follows, the elements common to two figures or more bear the same reference and will be described only once. Further, the invention will be illustrated, without that being limiting, by an optical alignment system used in an apparatus for transferring by direct photorepetition onto silicon. This apparatus will be called more briefly photorepeater.

A first variation of an optical system for aligning two patterns in accordance with the invention will be described with reference to FIGS. 1 to 3.

Figure 1:
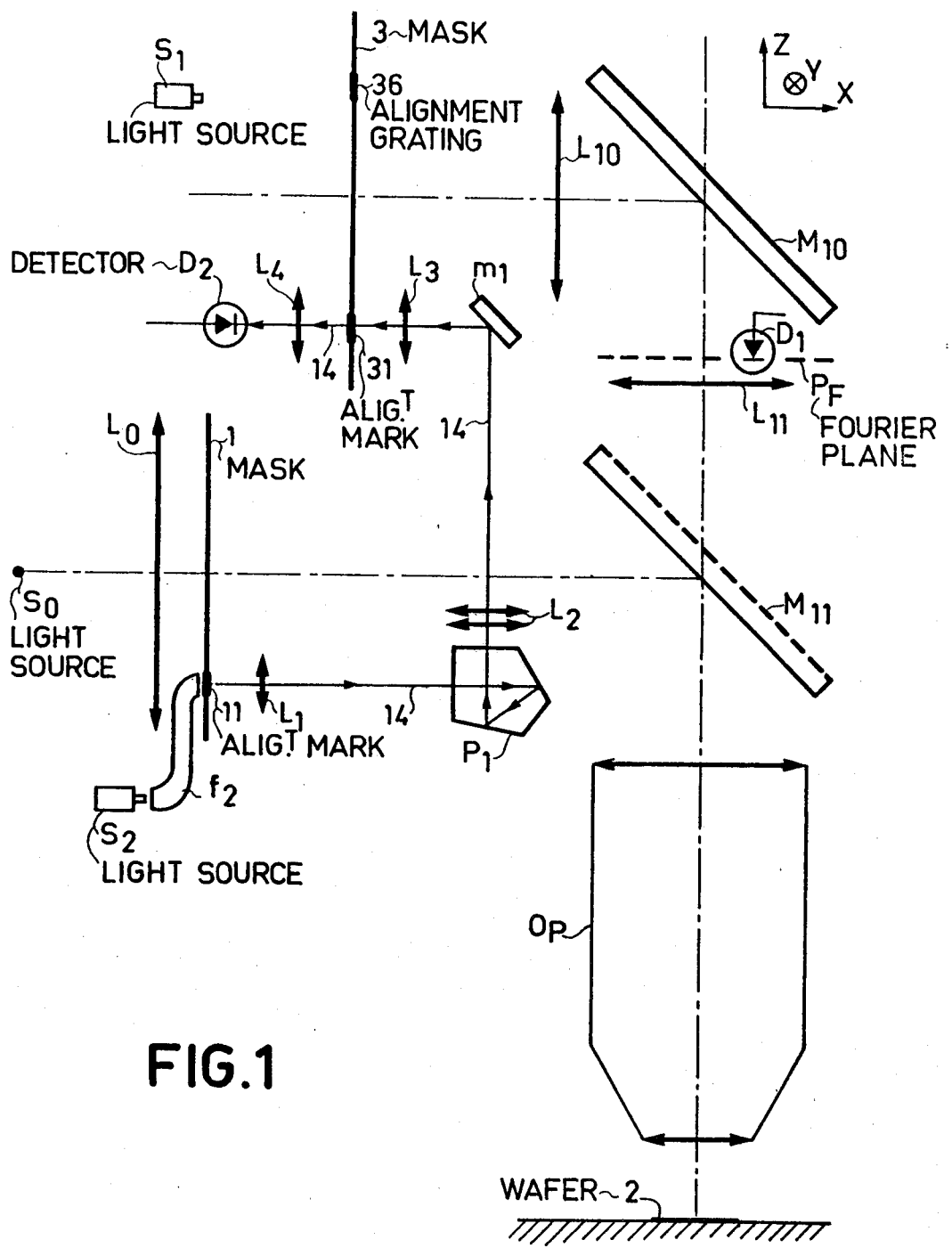
FIGS. 1 to 3 illustrate a first variation of the optical alignment system of the invention.

FIG. 1 illustrates schematically the first phase required for aligning two patterns and, more specifically in accordance with the invention, for aligning along two reference axes X and Y alignment reference marks carried respectively by a reticle and a semiconductor wafer. In FIG. 1, as well as in the following figures, only the component parts of a photorepeater indispensable to the understanding of the present invention have been shown. The other elements forming a photorepeater are known by the man skilled in the art and do not form a part of the scope of the invention.

As has been mentioned, the formation of an integrated circuit on a semiconductor wafer comprises a step which consists in projecting one or more patterns, carried by one or more reticles, onto said semiconductor wafer. It is also known that these operations require preliminary or intermediate steps for aligning the semiconductor wafer with respect to the reticle. For this, it is also known to provide respectively on the reticle (in addition to the patterns to be projected) and on the semiconductor wafer, additional patterns formed of alignment reference marks. These reference marks are in general at least two in number, which allows alignment along two coordinated axes X, Y. To carry out the alignment, it is customary to project the reference marks carried by the reticle onto the semiconductor wafer and the alignment is obtained when the projection of the reference marks carried by the reticle coincide with the corresponding reference marks carried by the semiconductor wafer.

In accordance with the first approach, the alignment of these pairs of reference marks is effected directly, in accordance with the second approach, to which the invention belongs, the alignment is effected by means of intermediate reference marks. The operation of an optical alignment system using such a process is then of the sequential type, i.e. the final alignment is achieved after several intermediate alignment phases. The invention proposes an optical alignment system using an alignment process making use of an intermediate pattern and requiring only a reduced number of intermediate alignment phases while providing great accuracy in the alignment.

The principal component elements of a photorepeater will first of all be recalled. In a photorepeater for example the one illustrated schematically in FIGS. 1 to 3, a pattern carried by a reticle 1 must be projected, by means of a projection objective $O_P$, onto a semiconductor wafer 2. In accordance with the invention use is made of an intermediate mirror $M_{11}$ bending the projection beam 17 (FIG. 3) back onto itself.

Figure 4:
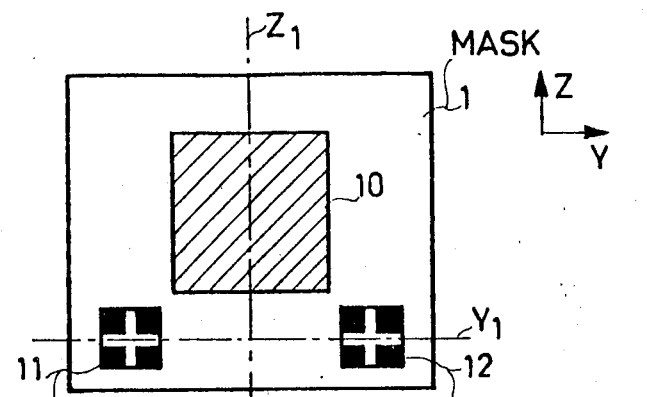
FIGS. 4 to 7 illustrate in greater detail elements of the invention.

Reticle 1 is illustrated in greater detail in FIG. 4. This reticle comprises a central zone 10 bearing the pattern to be projected and a pair of alignment reference marks formed by additional patterns 11 and 12 aligned along an axis $Y_1$ parallel to the reference axis Y. These two latter reference marks 11 and 12 are situated symmetrically with respect to an axis of symmetry $Z_1$ and on each side of pattern 10.

Figure 6:
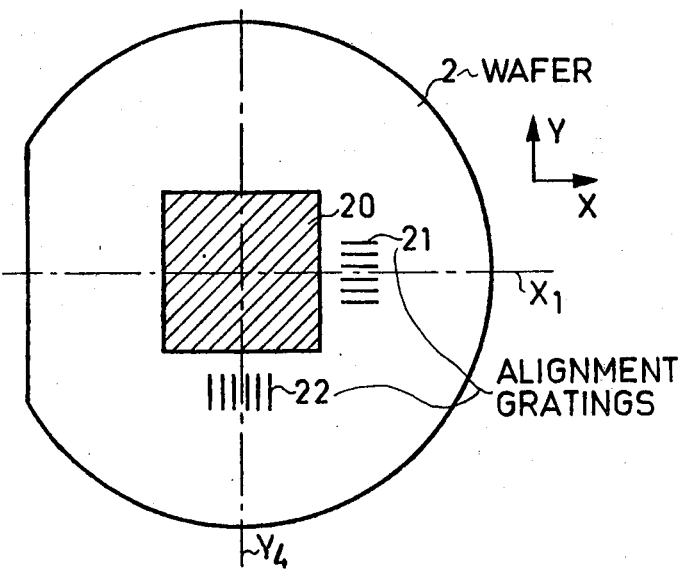

The semiconductor wafer is illustrated in more detail in FIG. 6. Pattern 10 of reticle 1 will be projected at 20 onto the semiconductor wafer 2. This wafer also comprises a pair of alignment reference marks formed by patterns 21 and 22 situated respectively on axes of symmetry $X_1$ and $Y_4$ and disposed at the periphery of zone 20. Axes $X_1$ and $Y_4$ are respectively parallel to the reference axes X and Y.

Figure 5:
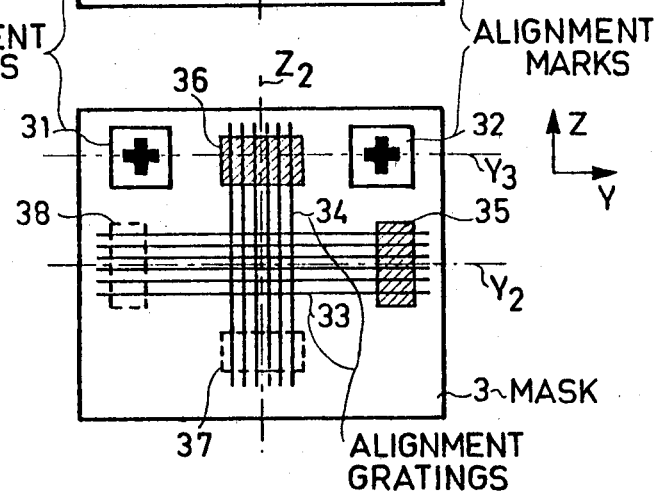

In accordance with the invention the mobile reticle 1 will first of all be aligned with respect to the intermediate reference marks connected to the machine. For this, an additional reticle 3 is used having pairs of reference marks complementary to those carried by reticle 1 and wafer 2, and which is fixed with respect to the frame of the photorepeater. This reticle 3 is illustrated in more detail in FIG. 5. It comprises, aligned along an axis $Y_3$ parallel to reference axis Y, on each side of an axis of symmetry at $Z_2$, two alignment reference marks formed by patterns 31 and 32 complementary to patterns 11 and 12 of reticle 1. The distance separating these two patterns 31 and 32 is equal to the distance separating the centers of patterns 11 and 12. It also comprises patterns 33 and 34 serving as reference marks for alignment with respect to reference marks 21, 22 of the semiconductor wafer.

FIG. 1 illustrates the first phase of the alignment. This alignment may bring into use different processes of the known art. By way of nonlimiting example, there may be mentioned the processes described in the following publications: American publication "Applied Physics Letters", Vol. 31, No. 7, Oct. 10, 1977, page 426 to 428; French publication "Revue Technique THOMSON-CSF", vol. 10, No. 4, December 1978, pages 733 to 755; French patent application No. 77.11 908, filed on Apr. 20, 1977 and published under the No. 2,388,371; and the European patent application published under the No. EP-A1-0015 17 3 on Sept. 3, 1980.

In what follows, and for the sake of clarity, it is assumed that, on the one hand, the pair of reference marks 31–32 connected to the machine and, on the other hand, the pair of reference marks 11 and 12 carried by the reticle 1 are formed by optically complementary crosses. Fixed reticle 3 is disposed in the photorepeater so that axis $Y_3$ joining the center of reference marks 31 and 32 is parallel to one of the axes of translation of the table which, as is known, supports the semiconductor wafer, and this with an accuracy of a second of an arc. In the chosen example, this axis $Y_3$ is parallel to axis Y. The zones bearing alignment reference marks 11 and 12 are illuminated, for example, by means of an optical fiber endoscope $f_2$ projecting on these reference marks a light beam produced by a source $S_2$. This source $S_2$ may be formed by a laser; particularly an He Ne laser having a wavelength of 6328 Å. The image of reference mark 11, for example, is projected by means of the optical system comprising lenses $L_1$ and $L_3$ as well as the double reflection prism $P_1$ and mirror $m_1$. The unit comprised by this optical system is equivalent to a projection objective with magnification of +1. The coincidence of reference marks 11 and 31 is detected by an opto-electronic device shown schematically in FIG. 1 by diode $D_2$ and converging lens $L_4$. The path of the light rays appears under the reference 14.

Figure 9:
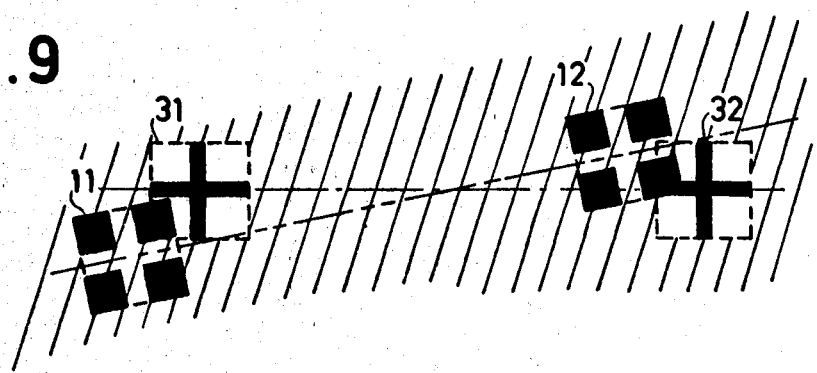
FIGS. 9 and 10 illustrate in a more detailed way another phase of the alignment of the invention.
Figure 10:
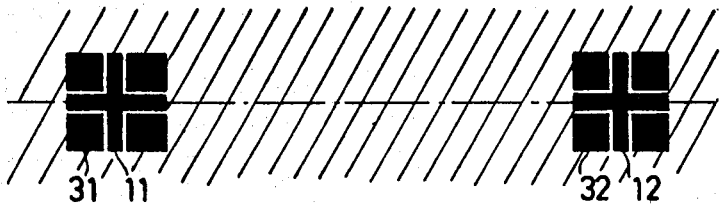

Actually, in addition to alignment along two coordinate axes, respectively Y and Z in FIG. 1, the reticle must also be positioned angularly. For this, the process described in the above-mentioned French patent application No. 77.11 908 may be used. FIGS. 9 and 10 illustrate in greater detail two steps of the phase for aligning the pairs of reference marks respectively 11-12 and 31-32. During this alignment phase, the signals detected by the opto-electronic means $D_2$ are used in associated electronic circuits, not described. These circuits are well-known to the man skilled in the art and are outside the scope of the present invention. It should be noted that the relative positions of source $S_2$ and opto-electronic means $D_2$ are immaterial; the path of rays 14 may be reversed, and example of such an arrangement will be described later on with reference to FIG. 15.

Although in FIG. 1 only the alignment of reference mark 31 with respect to reference mark 11 has been shown, it is evident that an optical system of +1 magnification as well as a light energy source and opto-electronic detection means are also associated with the pair of reference marks to be aligned 12 and 32.

Once the accurate positioning of the reticle bearing the pattern to be projected has been obtained with respect to the machine reference marks, the second phase of alignment in accordance with the invention consists in also positioning accurately the semiconductor wafer 2 with respect to the reticle bearing the machine reference marks. This second phase of the alignment is illustrated by FIG. 2. Besides reference marks 31 and 32, the reticle connected to the machine (and illustrated by FIG. 5) also comprises another series of reference marks, shown as 33 and 34, which will also be used during this second alignment phase.

In a preferred embodiment, these reference marks will be of the optical network type. Such networks have been described in the above-mentioned European patent application. Though it is in fact easy to determine with precision the level of the contrast of the reference marks borne on the reticles and this with constancy from one reticle to the other, it is not easy to obtain this same result with the reference marks borne by the semiconductor wafer. The contrast of the reference marks on the silicon is very variable from one integration level to another, considering the variations of oxide thickness or of the nature of the deposits (polycrystalline silicon, aluminium). The quality of the alignment will then be essentially variable. It depends either on the visual acuity of the operator in the case of the manual alignment process, or on the power of resolution of the associated electronic means when the alignment is automatic. In what follows, the positioning of the semiconductor wafer with respect to the reference marks connected with the machine will preferably take place in accordance with the process described in this patent application which palliates these disadvantages.

For this, a part of the patterns in the form of networks 33 and 34, said part being defined by windows, for example windows 35 and 36 (FIG. 5), will be projected onto the corresponding alignment reference marks 21 and 22 of semiconductor wafer 2, said reference marks being illustrated in FIG. 6. These reference marks are disposed on each side of the projected pattern 20, along two axes $X_1$ and $Y_4$ respectively parallel to the reference axes X and Y.

Figure 2:
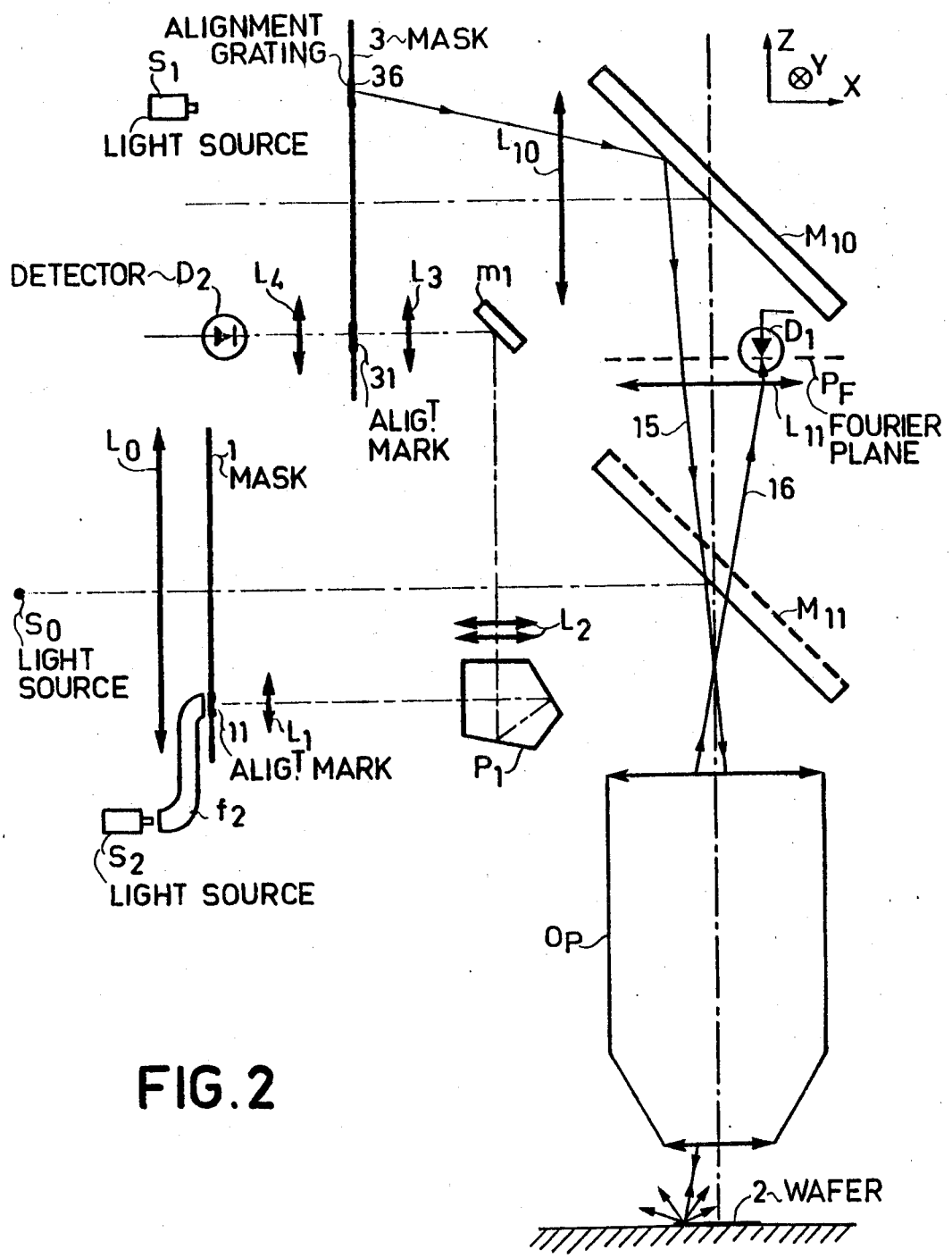

In FIG. 2, the reference marks 35 and 36 illuminated by a coherent source of radiant energy $S_1$ are projected by means of an optical system comprising lenses $L_{10}$, $L_{11}$, mirror $M_{10}$ and a plate $M_{11}$ serving as a partially reflecting mirror as well as objective $O_P$ for projection onto semiconductor wafer 2. Windows 35 and 36 are positioned on reticle 3 so as to correspond through the complete optical system with reference marks 21-22 of the semiconductor wafer. Their position depends on the size of the circuit seen through optical system $O_P$, these windows 35 and 36 may be moved on the reticle 3 along axes $Z_2$ and $Y_2$ to adapt them to the spacing and to the position of patterns 21 and 22.

Figure 7:
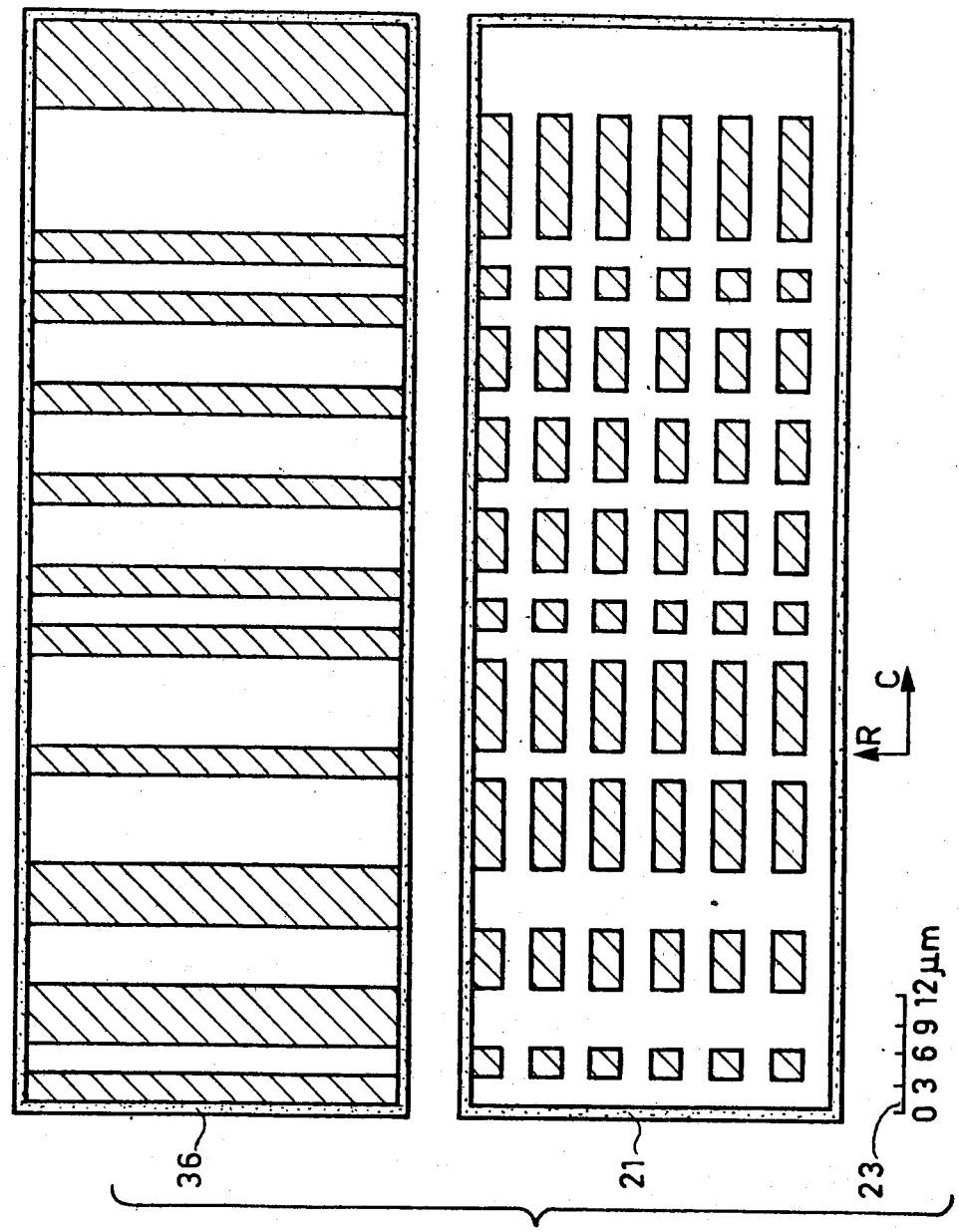
Figure 8:
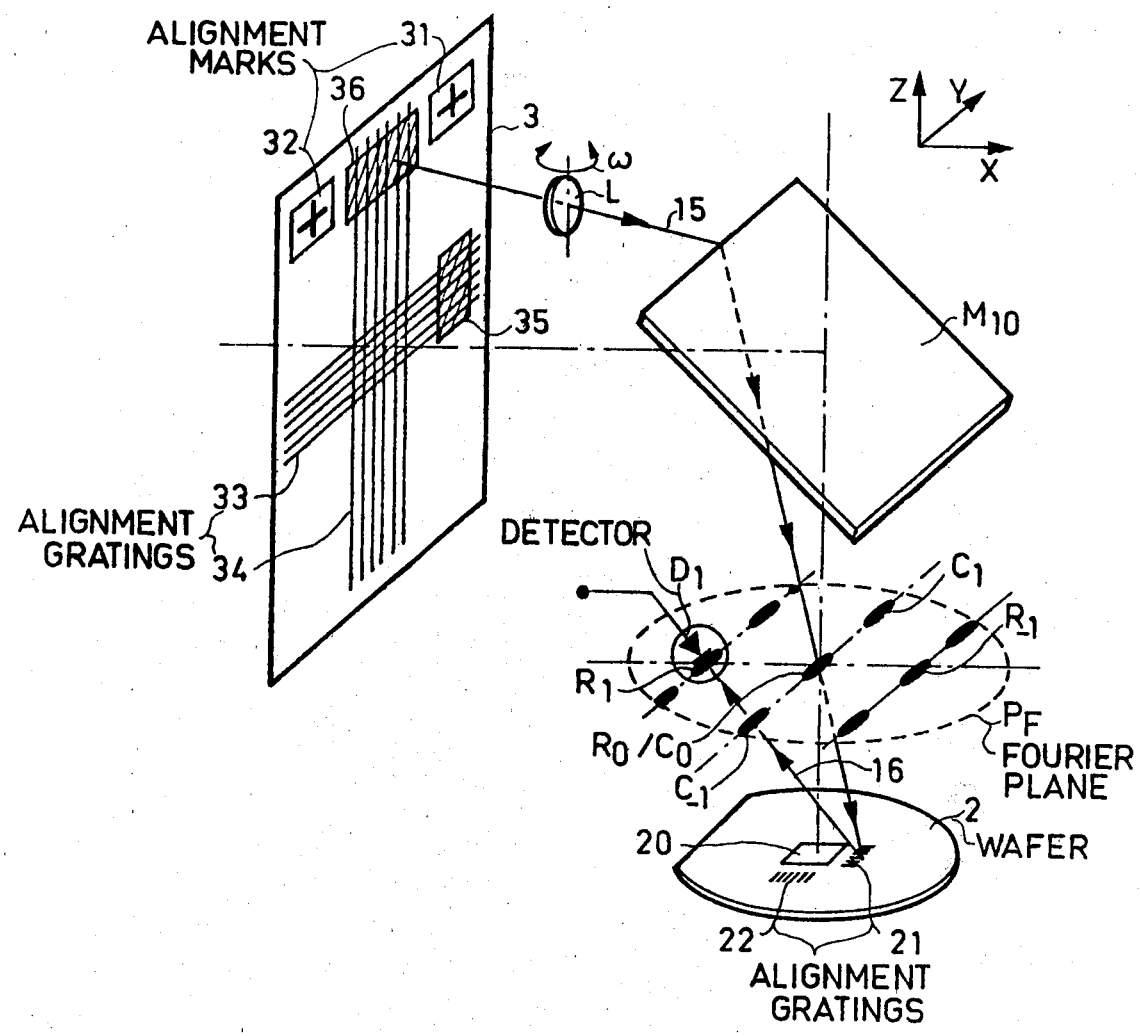
FIG. 8 illustrates in a more detailed way one of the phases of the alignment according to the invention.

It is desirable first of all to recall the essential part of the process described in the above-mentioned European patent application. The implementation of this process within the specific scope of the invention is illustrated schematically with reference to FIG. 8. A first pattern formed by two optical networks 21-22, disposed along two axes of coordinates X and Y in the chosen example, is illuminated by the image of a second pattern comprising two optical networks 35-36, forming a reference, and produces orders of diffraction. The two networks 35-36 are disposed along two axes Z and Y. The beam of alignment rays 15 is reflected back on itself by mirror $M_{10}$. The projection optical means $O_P$ has been omitted in FIG. 8. An example of a usable optical network is illustrated in FIG. 7. These optical networks are formed by a succession of parallel strokes whose thickness in spatial distribution along a direction C is determined by a pseudo-random code. The upper part of FIG. 7 illustrates the network defined by window 36. The networks defined by window 35 or windows 37 and 38 are identical. The network of the lower part of FIG. 7 illustrates the network 21 borne by the semiconductor wafer. This network is identical to network 22. This network is identical optically to the network borne by reticle 3 connected to the machine. The strokes of this network are furthermore periodically interrupted in a direction R so as to form a constant-pitch network; directions R and C being orthogonal to each other and each parallel to one of the reference axes X or Y.

The image of network 36 is projected onto network 21 borne by the semiconductor wafer. The illumination source $S_1$ may also be an He Ne laser identical to that of source $S_2$. The dimension of optical network 36 is such that it may be superimposed on network 21 in direction C, taking into account the magnification of the optical means. By way of indication the dimensions of the network may be deduced from scale 23. The network 21, illuminated by the image of network 36, will produce orders of diffraction in two privileged directions, i.e. in directions C and R or what amounts to the same thing in directions X and Y. The orders of diffraction in directions 16 will be able to be detected in the Fourier plane $P_F$. This Fourier plane is situated in the image of the pupil of the projection objective $O_P$ (not shown in FIG. 8). There is shown in this plane the orders of diffraction $C_0$, $C_1$, $C_{-1}$ for the direction parallel to the reference axis Y and the orders $R_0$, $R_1$ and $R_{-1}$ for the direction parallel to the reference axis X. The order of diffraction $R_1$ is detected by an opto-electronic means symbolized by diode $D_1$. The output signals of these opto-electronic means $D_1$ are transmitted to appropriate electronic means, not shown. The order $R_{-1}$ may also be detected and the signals representing the intensity of these two orders ($R_1$, $R_{-1}$) may be electronically summated. Network 22 for alignment of path X will diffract in directions orthogonal to the directions of diffraction of network 21. This technique allows the alignment signals X and alignment signals Y to be discriminated spatially, if the pitches of the networks in directions R and C are distinct. If not, filtering may for example be achieved by using two orthogonal polarizations of the light energy sources illuminating networks X and Y or else a time-sharing technique may be used by illuminating alternately windows 35 and 36.

As described in the above-mentioned European application, other types of networks may be used and, for example, networks having constant pitches in the two directions R and C, associated with auxiliary networks for removing the indetermination due to the periodicity of the networks because of these constant pitches.

There may also be inserted in the outgoing path of rays 15 a plate L driven with a reciprocal oscillating movement ω, of constant amplitude and predetermined frequency, thus modulating the position of the image of network 36 projected on network 21. The intensity of the diffracted rays 16 is then modulated in amplitude and this modulation facilitates use of the signals delivered by opto-electronic means $D_1$, with a view to the automatic control of the position in plane X Y of the semiconductor wafer. This wafer is integral with a table of translation moved along two axes X and Y by means of motors receiving servo-control signals coming from the processing, by the electronic circuits, of the signals detected by the opto-electronic alignment means. These techniques are well-known to the man skilled in the art and will not be described further. By way of one variation among others, the modulation of the detected signal may also be obtained by a weak modulation of the position X Y of the semiconductor wafer (of the order of a few tens of microns).

Thus a circuit, or portion, of the semiconductor wafer has been aligned. This circuit is symbolized by zone 20 in FIG. 6. In reality this zone 20 is repeated a number of times along lines and columns. Since the dimension of reference marks 21 and 22 is very small it is necessary to align at least two circuits disposed at two diametrically opposed locations on the wafer and situated at the periphery so as to obtain angular alignment of the semiconductor wafer. This alignment may require repeated operations. FIG. 3 illustrates a subsequent phase during which the semiconductor wafer 2 is exposed, i.e. during the transfer. For this, the pattern defined by window 10 of reticle 1 (FIG. 4) is projected onto the semiconductor wafer at 20. The light energy source $S_0$ may be formed by a mercury lamp, associated with line filters, not shown, and with a capacitor $L_0$. The projection beam 17 is reflected by plate $M_{11}$ forming a partially reflecting mirror and passes through the optical projection system $O_P$ before reaching semiconductor wafer 2. It should be noted that this projection beam does not interfere with the optical systems associated with alignment reference marks 11 and 12. In fact, these reference marks are situated on each side of window 10 as shown in FIG. 4 and may then be left in position during the exposure phase.

Lenses $L_{10}$ and $L_{11}$ form an optical correction means for counter-balancing the differences in wavelength between alignment and transfer, as well as the aberrations introduced when passing through plate $M_{11}$.

The only requirements insofar as mirror $M_{10}$ is concerned are that it should have sufficient inherent flatness of the order of λ/10. It is also preferably treated as a monolayer or multilayer to avoid variation of the reflection coefficient.

The semireflecting plate $M_{11}$ is formed by a multidielectric mirror. Its coefficient of reflection may be 0.99 in the range 4050 Å $<\lambda<$ 4350 Å (depending on the wavelength chosen for the exposure) and its coefficient of transmission of the order of 0.5 for $\lambda=6328$ Å, if this wavelength is chosen for the alignment (He Ne laser), or for any other wavelength. The projection objective $O_P$ is corrected for the wavelength selected for the projection (or transfer). As has been mentioned the light energy source may be a mercury lamp with extended spectrum. A particular spectral line is selected by means of a filter, for example line $\lambda=4059$ Å. This value must correspond to the maximum sensitivity of the photosensitive resin deposited on the semiconductor wafer. The projection objective may, for example, be an objective of the CERCO make of the 744 type having a reduction ratio of 1/5. The opto-electronic detection means may be either photodiodes (for example the EGG make, type SGD 100 or HAD 1000 A) or a photomultiplier (for example that made by RTC, type XP 117). The other components (lenses, prisms, etc. . . . ) may be selected from those usually used for photorepeaters of the known art, particularly insofar as the mobile tables carrying reticle 1 and semiconductor wafer 2 are concerned.

Finally mirror $M_{10}$ may also be of the same type as mirror $M_{11}$, which enables, for example by means of a television camera not shown, the result of the alignment to be observed, and this with complete simultaneity.

A single source of radiant energy only may be used common to the two phases of alignment and exposure. During the alignment phases, the source is highly diaphragmed so that a substantially coherent illumination of low intensity is obtained. The low intensity of the light limits the exposure risks, the wavelength being that for which the resin is sensitive.

A second embodiment of the optical alignment system of the invention will now be described with reference to FIGS. 11 to 13. In this embodiment, we find again the essential elements of the invention:

correspondence of the +1 scale between the alignment reference marks carried by the reticle and the alignment reference marks connected to the machine, which reference marks are used during the first phase of the alignment;

use of coded optical networks during the second phase of alignment of the reference marks borne by the silicon wafer 2 and of the reference marks also connected to the machine.

Figure 3:
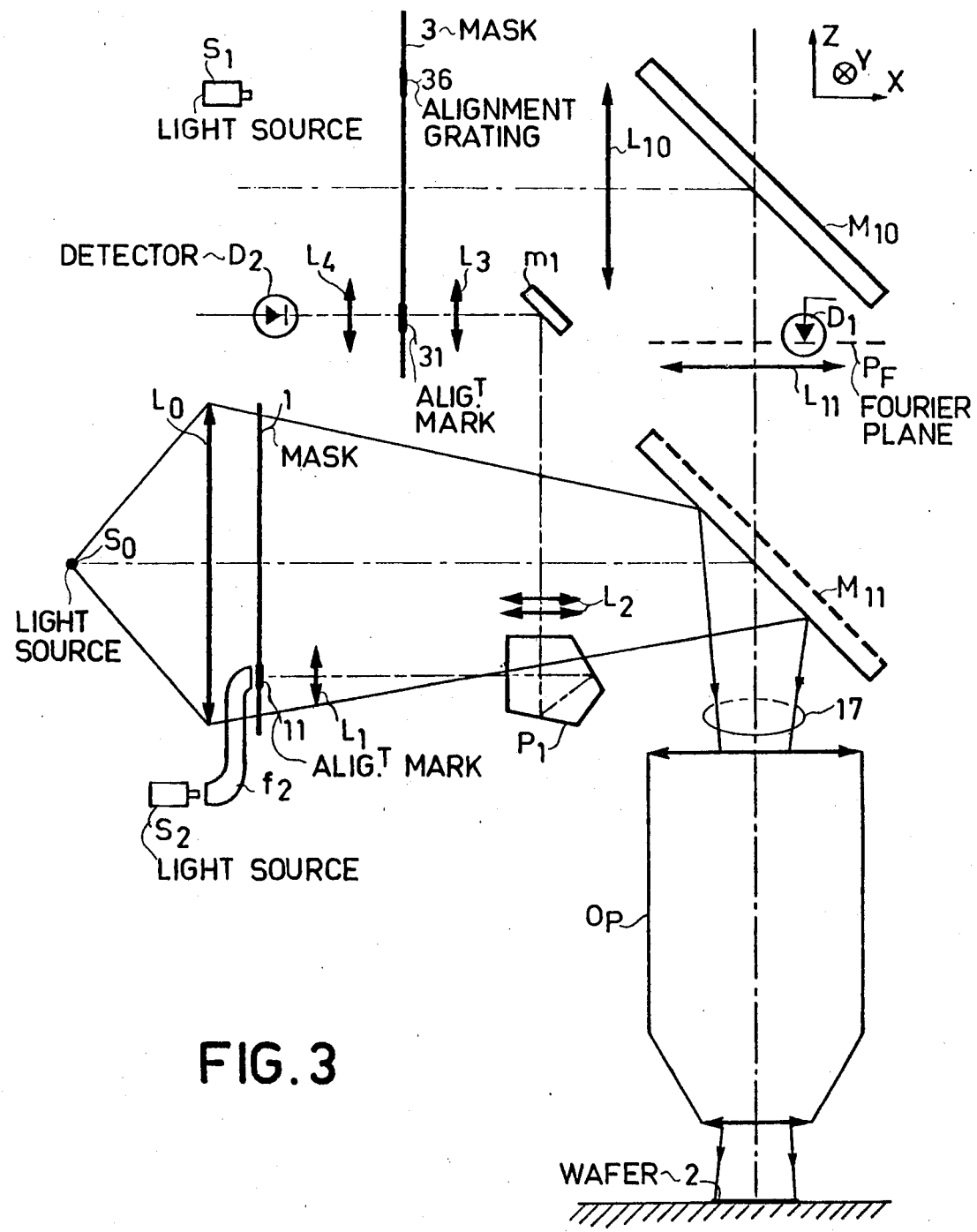
Figure 11:
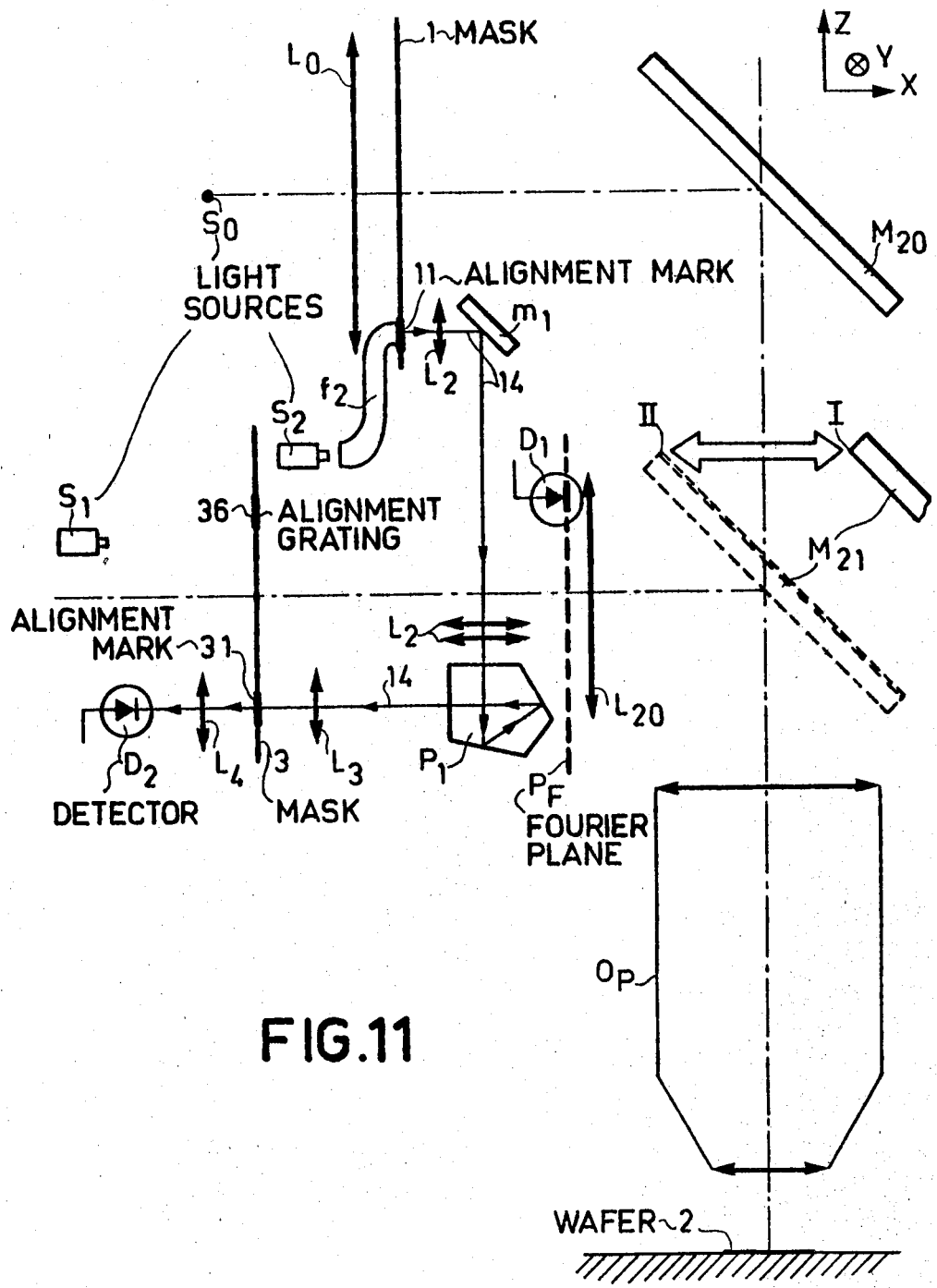
FIGS. 11 to 13 illustrate the phases for aligning a semiconductor wafer with respect to a reticle in accordance with the second variation of the invention.
Figure 12:
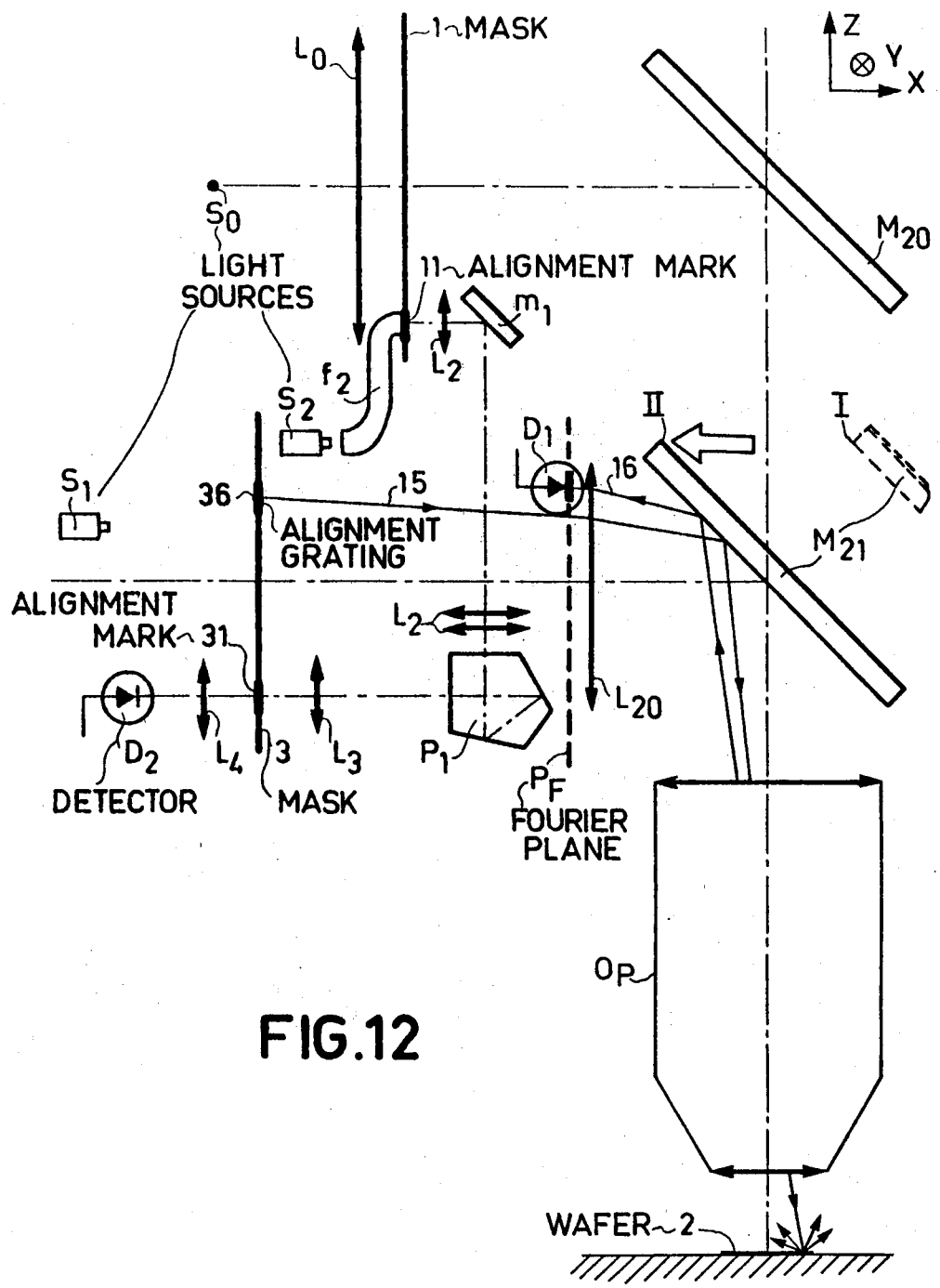
Figure 13:
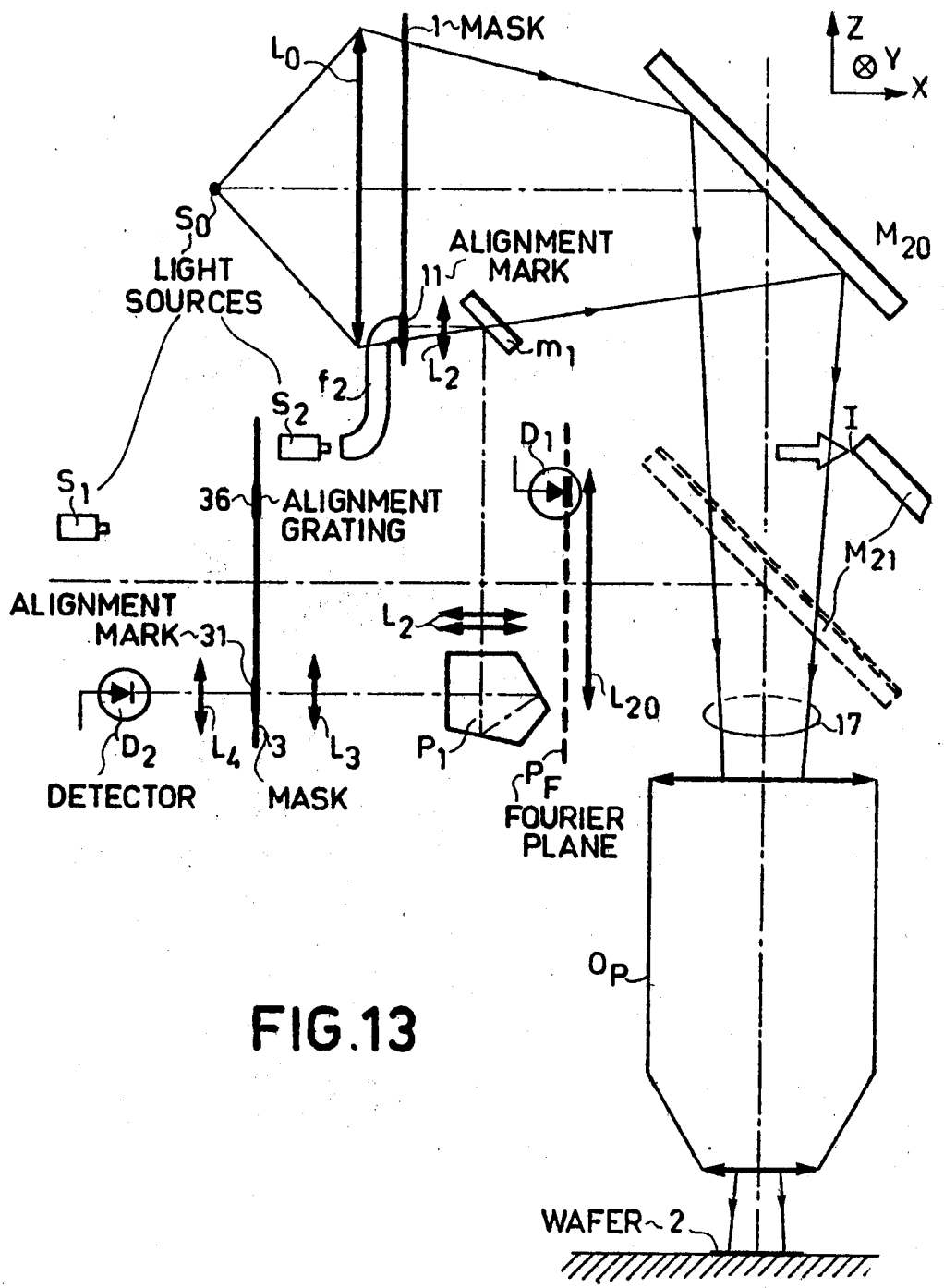

The elements of FIGS. 11 to 13 bearing the same reference numbers as those of FIGS. 1 to 3 are identical and will not be described again. The second embodiment of the invention differs from the first by the following points:

the respective positions of reticle 1 and reticle 3 are reversed;

mirror $M_{21}$ is a switchable mirror in reference plane X Y along one of the axes X or Y. In the example described with reference to FIGS. 11 to 13, this mirror may be moved between positions I and II along axis X.

During the first phase of the alignment, reticle 1 is positioned accurately by using a process similar to the one described with reference to FIG. 1. During this phase, although mirror $M_{21}$ is shown in FIG. 11 in position I, the position of mirror $M_{21}$ is immaterial.

During the second phase of the alignment, semiconductor wafer 2 is in its turn accurately positioned by using the process described with reference to FIG. 2. Mirror $M_{21}$ must however be caused to undergo a translation bringing it into position II, so as to intercept and reflect the incident beam 15 and beam 16 emerging from the projection objective $O_P$. The detection of the orders of diffraction is also effected in the Fourier plane $P_F$ by the opto-electronic means $D_1$.

FIG. 13 illustrates the projection phase, the alignment being attained. The mirror must then be switched back to position I.

Insofar as mirror $M_{21}$ is concerned, a precise stop in direction Y is not necessary. Only the positioning of mirror $M_{21}$ along axes X and Z must be carried out with precision so that the image projected onto the semiconductor wafer 2 is of good quality. Typically, if a precision of the order of 0.1 micrometers is desired on semiconductor wafer 2, the positioning of the mirror must be reproducible with an angular precision of the order of 0.2 seconds of an arc and a linear precision of 0.2 $\mu$m. These positioning reproducibilities are compatible with the use of the translation tables available in photurepeaters of the prior art, for example a translation table of the type having crossed rollers or a table having an air cushion. This translation table has not been shown in FIGS. 11 to 13.

With this requirement fulfilled, the embodiment described with reference to FIGS. 11 to 13 presents numerous advantages:

mirror $M_{21}$ may also play the role of shutter for the exposure. Further, the surface quality of this mirror may be less than that required for plate $M_{11}$ used for the first embodiment (FIGS. 1 to 3);

the optical compensation means is reduced to a single lens $L_{20}$ for it only serves for correcting the wavelength difference between the sources used for alignment and for projection. This optical compensation means is only necessary if two distinct wavelengths are used;

aberrations are not introduced during the alignment phase as is the case for the first embodiment of the invention, for the alignment beam must pass through plate $M_{11}$ of FIG. 1.

Figure 14:
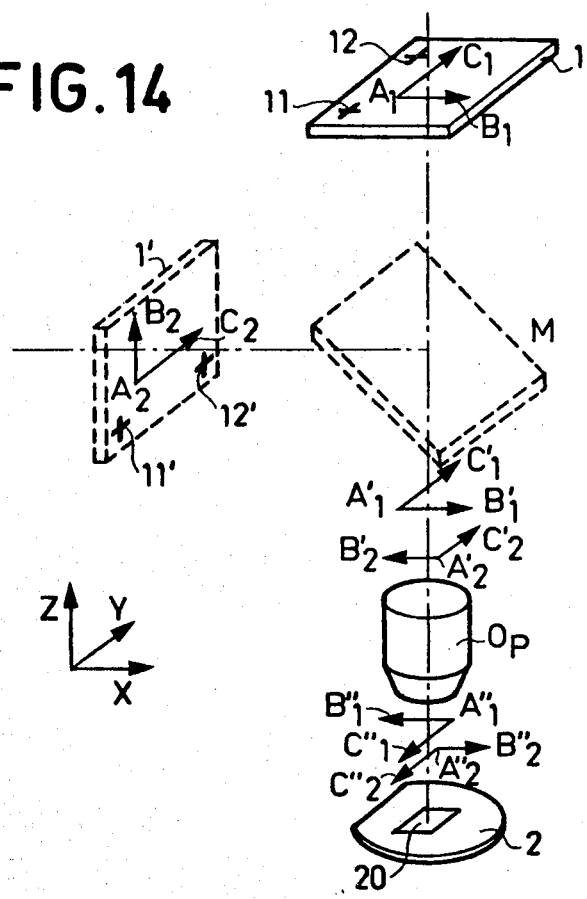
FIG. 14 illustrates a particular aspect of the first and second variations of the invention.

Although presenting numerous advantages, the two embodiments of the optical alignment system which have just been described can only be used in a photorepeater having an original structure, different from the majority of photorepeaters of the prior art. In particular, during the final phase of exposure of the semiconductor wafer, the projection beam is reflected back on itself by a change-of-direction mirror: $M_{11}$ in FIG. 3 and $M_{20}$ in FIG. 13. This arrangement allows an improved compactness of the photorepeater to be obtained. However, the reticle bearing the pattern to be projected 10 is not compatible in this case with the reticles used for the photorepeaters of the prior art, because of the presence of the change-of-direction mirror. This phenomenon is illustrated in FIG. 14.

In direct projection, i.e. without a change-of-direction mirror M, a dihedron $A_1 B_1 C_1$ carried by a reticle 1 (on which also appear alignment reference marks 11 and 12) will be projected onto the semiconductor wafer in the configuration shown in the figure by the dihedron $A_1'' B_1'' C_1''$ after passing through the projection objective $O_P$. In FIG. 14 there is also shown the position of this dihedron $A_1', B_1', C_1'$ at the input to objective $O_p$.

On the other hand a dihedron $A_2 B_2 C_2$ borne by a reticle 1' (also bearing alignment reference marks 11' and 12') will be reflected by a change-of-direction mirror M and will be in the configuration of the dihedron $A_2' B_2' C_2'$ at the input to projection objective $O_P$. At the output of the projection objective the position of the dihedron is $A''_2 B''_2 C''_1$. This figure clearly illustrates the noncompatiblity of the alignment systems of the two embodiments which have just been described.

A third embodiment of an optical alignment system in accordance with the invention, safeguarding this compatibility, will be described with reference to FIG. 15. In this figure we find again the principal elements of the two previous embodiments. In this embodiment, the transfer of the patterns 10 to be projected at 20 onto semiconductor wafer 2 is effected directly, i.e. without a change-of-direction mirror. The plane of reticle 1 is parallel to reference plane X Y. The same goes for the plane of reticle 3 bearing the reference marks connected with the machine. In a preferred embodiment, these two reticles 1 and 3 may be coplanar.

Figure 15:
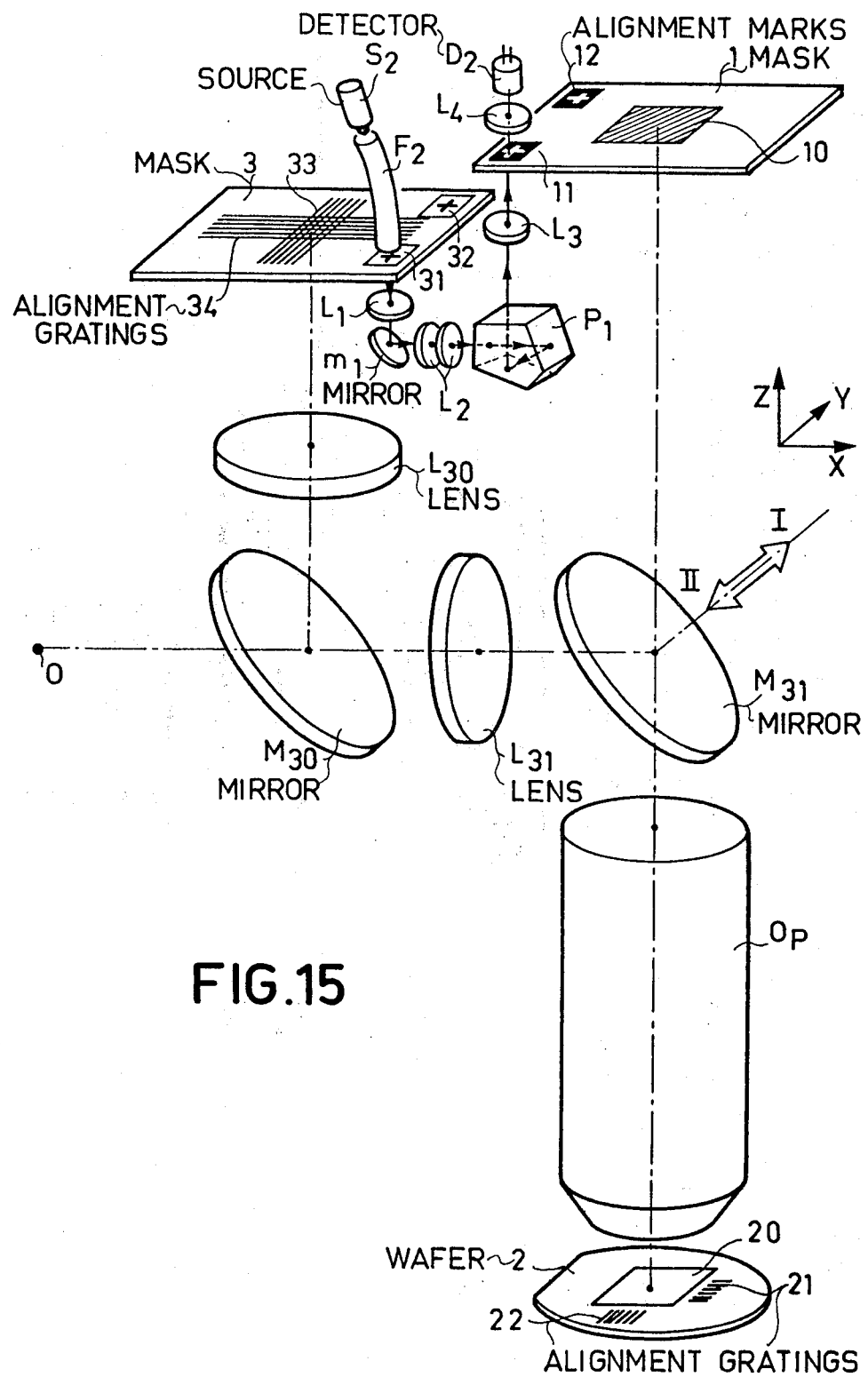
FIG. 15 illustrates one of the phases for aligning a semiconductor wafer with respect to a reticle in accordance with a third variation of the invention.

FIG. 15 illustrates more particularly the first phase of the alignment, i.e. the alignment of one with respect to the other of the pairs of reference marks respectively 31-32 and 11-12. Contrary to FIGS. 2 and 12, so as to illustrate the reversibility of the process, reference mark 31 (and also reference mark 32) is illuminated by source $S_2$ via the optical fiber $f_2$ and the opto-electronic detection means $D_2$-$L_4$ are placed opposite reference mark 11 (the same goes for reference mark 12).

During the second alignment phase the illuminated part of networks 33 and 34 will be projected onto the corresponding networks 21 and 22 borne by semiconductor wafer 2, through an optical system comprising lenses $L_{30}$ and $L_{31}$, projection objective $O_P$ and two change-of-direction mirrors $M_{30}$ and $M_{31}$. As for the second embodiment described with reference to FIGS. 11 to 13, mirror $M_{31}$ must be switchable between two positions I and II. In the example shown in FIG. 15, the switching is effected in a direction parallel to reference axis Y. The position II corresponds to the alignment position, the position I corresponding to the exposure position.

The correction optical means, represented by lenses $L_{30}$ and $L_{31}$ is such that it allows focusing on semiconductor wafer 2 at the wavelength of the alignment, objective $O_P$ being corrected for the wavelength used for the transfer. This optical correction means may also be calculated so that the plane comprising the reference marks connected with the machine is equivalent to the plane of the reticle.

As in the case of the first embodiment, the mirror $M_{30}$ used during the phase of alignment of the reference marks borne by the semiconductor wafer 2 with respect to the reference marks connected with machine 3 may be partially reflecting at the alignment wavelength so as to be able to observe at point O the result of the alignment.

The invention is not limited to the embodiments which have just been described. In particular the alignment system of the invention may be applied to any device used for the precise positioning, one with respect to the other, of two objects on which are provided at least one alignment pattern, said alignment taking place with respect to an intermediate reference pattern borne by a fixed support.

What is claimed is:

1. An optical system for aligning with respect to each other a first pattern having a first and second portion borne by a first mobile support and a second pattern borne by a second mobile support by means of a third intermediate pattern having a first and second portion forming a reference, said system comprising radiant energy source means and having, with said third pattern borne by a fixed support, first optical means with +1 magnification, combining means for optically combining said first portion of said first pattern and said first portion of said third pattern and first opto-electronic means detecting the coincidence of the optical projection of one of said first portion of said first and third patterns on the other of said first portion of said first and third patterns, and comprising further second optical means with a given magnification for optically combining said second pattern and said second portion of said third pattern and second opto-electronic means detecting the coincidence of the optical projection of said second portion of said third pattern on said second pattern.

2. The system as claimed in claim 1, wherein said first portion of said first pattern comprises a first pair of alignment reference marks disposed along an axis and spaced from each other by a given length, each reference mark comprising at least two zones of different optical density and wherein the first portion of said third pattern comprises a second pair of alignment reference marks optically complementary to the reference marks of said first portion of said first pattern, disposed along an axis and spaced from each other by the same given length.

3. The system as claimed in claim 2, wherein said first optical means with a magnification equal to +1, comprise for each alignment reference mark of said first pattern to be optically combined with said reference marks of said third pattern, a double-reflection prism, a change-of-direction mirror and a plurality of lenses, and wherein the radiant energy source means comprise a first source associated with optical means concentrating the light energy only on the alignment reference marks.

4. The system as claimed in claim 1, wherein said second pattern comprises a pair of optical networks forming alignment reference marks, disposed respectively along two orthogonal axes, spaced by the same first, respectively second distance from the point of intersection of the two orthogonal axes, and wherein said second portion of said third pattern comprises furthermore a third pair of reference marks formed by optical networks complementary to the networks of said second pattern; these networks being disposed along two orthogonal axes.

5. The system as claimed in claim 4, wherein the optical networks of said second and third patterns are each formed by a succession of parallel strokes whose width and spatial distribution in a first direction are determined by a particular distribution code; the strokes of the optical networks of said second pattern being furthermore periodically interrupted in a second direction so as to form an optical network with constant pitches in this direction; and wherein:
the radiant energy source means are formed by at least one second monochromatic radiant energy source combined with second optical means for illuminating said second pattern by projection on this pattern of the image of said third pattern with the given magnification and to produce orders of diffraction in said first and second directions; the monochromatic source illuminating predetermined network parts of said third pattern, defining two illumination windows with homothetic surface at the surface of the networks of said second pattern in the inverse ratio of said given magnification and at the same third, respectively fourth distance from the point of intersection of the two orthogonal axes, the common ratio between said first and third distances and said second and fourth distances being equal to the magnification; and said second opto-electronic means detect the intensity of a predetermined part of the orders of diffraction in said second direction, the detected intensity passing through a maximum and the precise alignment being obtained when the spatial correlation of said second pattern and of the projection of the image of said third pattern on said second pattern is maximum.

6. The system as claimed in claim 5, wherein said fixed support is made from a transparent material on which is inscribed said third pattern formed by strokes defining the alternate zones differentiated by their coefficient of transmission; and wherein said second mobile support is made from a reflecting material on which is etched said second pattern formed by strokes defining alternate zones differentiated by thickness or nature.

7. The system as claimed in claim 4, wherein said first and third patterns are in parallel planes and said second pattern is in a plane orthogonal to the plane of said first and third patterns.

8. The system as claimed in claim 7, wherein said second optical means of given magnification comprise an objective for projection at the given magnification and a fixed mirror reflecting back by $\pi/2$ the beam rays used for aligning said third and second patterns and produced by said monochromatic source.

9. The system as claimed in claim 4, wherein said first and third patterns are in the same plane and said second pattern is in a plane parallel to the plane of said first and third patterns.

10. The system as claimed in claim 9, wherein said second optical means of given magnification comprise an objective for projection at the given magnification, a fixed mirror reflecting back a first time by $\pi/2$ the beam of rays used for the alignment of said third and second patterns and produced by said monochromatic source and a mobile mirror reflecting back a second time by $\pi/2$ this beam; the mobile mirror being switchable between two positions in a plane parallel to the plane of said second pattern and in a direction parallel to one of said first or second directions.

11. A photorepeater for the alignment of a semiconductor wafer having on its upper face a layer of photosensitive resin and on which is inscribed a first alignment pattern, with respect to at least one reticle on which is inscribed a second alignment pattern, as well as other patterns to be projected on the wafer; said photorepeater comprising an optical alignment system as claimed in claim 1, wherein said second optical means at the given magnification comprise an objective for projection at said given magnification used alternately for projection of the image of said first alignment pattern on said second alignment pattern during alignment phases and for projection on said wafer at given locations of the image of said other patterns during exposure phases.

12. The photorepeater as claimed in claim 11, comprising at least one first radiant energy source having a first wavelength, activated during said exposure phases, and a second radiant energy source having a second wavelength, activated during said alignment phases; in which photorepeater said objective for projecting at the given magnification is corrected for said first wavelength and comprising optical focusing direction means compensating for the magnification and focusing deviation due to the use of radiations of different wavelengths.

13. The photorepeater as claimed in claim 12, wherein said second optical means of given magnification comprise further a mirror partially transparent at said second wavelength; this mirror having a coefficient of reflection substantially equal to one for said first wavelength.

14. The photorepeater as claimed in claim 11, comprising a single radiant energy source used alternately for alignment and exposure wherein, during said alignment phases, this source is heavily diaphragmed so as to obtain coherent illumination of very low intensity.

* * * * *